(12) United States Patent
Wu et al.

(10) Patent No.: US 8,361,891 B2
(45) Date of Patent: Jan. 29, 2013

(54) PROCESSES FOR FORMING CHANNELS IN THIN-FILM TRANSISTORS

(75) Inventors: Yiliang Wu, Oakville (CA); Jason S. Doggart, Burlington (CA); Ping Liu, Mississauga (CA); Shiping Zhu, Dundas (CA)

(73) Assignee: Xerox Corporation, Norwalk, CT (US)

( * ) Notice: Subject to any disclaimer, the term of this patent is extended or adjusted under 35 U.S.C. 154(b) by 841 days.

(21) Appl. No.: 12/332,827

(22) Filed: Dec. 11, 2008

(65) Prior Publication Data
US 2010/0151633 A1    Jun. 17, 2010

(51) Int. Cl.
*H01L 21/283* (2006.01)
*H01L 29/786* (2006.01)

(52) U.S. Cl. .................... 438/500; 438/154; 438/188

(58) Field of Classification Search ............ 438/21, 438/154, 188, 510
See application file for complete search history.

(56) References Cited

U.S. PATENT DOCUMENTS
2009/0001356 A1* 1/2009 Novack et al. .......... 257/40
2009/0272966 A1* 11/2009 Yamaga et al. .......... 257/40

FOREIGN PATENT DOCUMENTS
JP    2004-253681    * 9/2004

* cited by examiner

*Primary Examiner* — Zandra Smith
*Assistant Examiner* — Pamela E Perkins
(74) *Attorney, Agent, or Firm* — Fay Sharpe LLP

(57) ABSTRACT

Methods for consistently reproducing channels of small length are disclosed. An ink composition comprising silver nanoparticles and a surface modification agent is used. The surface modification agent may also act as a stabilizer for the nanoparticles. A first line is printed which forms a modified region around the first line. A second line is printed, which is repelled from the modified region. As a result, a channel between the first line and the second line is formed.

26 Claims, 4 Drawing Sheets

PROCESSES FOR FORMING CHANNELS IN THIN-FILM TRANSISTORS

CROSS-REFERENCE TO RELATED APPLICATIONS

This application is related to (20081679-US-NP, XERZ 202156). This application is hereby fully incorporated by reference herein.

BACKGROUND

Disclosed herein, in various embodiments, are methods for forming components of electronic devices, such as organic thin-film transistors. Components and devices made from or using these methods are also disclosed.

Fabrication of electronic circuit elements using liquid deposition techniques may be beneficial as such techniques provide potentially low-cost alternatives to conventional mainstream amorphous silicon technologies for electronic applications such as thin film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing, and cost requirements for practical applications have been a great challenge. The metal, silver, is of particular interest as conductive elements for electronic devices because silver is much lower in cost than gold and it possesses much better environmental stability than copper.

TFTs are generally composed of a supporting substrate, three electrically conductive electrodes (gate, source and drain electrodes), a channel semiconducting layer, and an electrically insulating gate dielectric layer separating the gate electrode from the semiconducting layer.

In particular, printing channels having a short length or gap consistently and reproducibly is very difficult at micrometer distances, yet is needed for organic thin-film transistors (OTFTs). For example, a channel between a source electrode and a drain electrode may be as small as 50 microns. It would be desirable to provide processes that allow for consistent production of channels on such scales.

One method is to pre-form a bank or banks to confine the location of the materials to be deposited. Using photolithographic methods to form the bank(s) could lead to small gaps. However, this approach complicates the fabrication process and increases manufacturing costs accordingly.

BRIEF DESCRIPTION

The present application discloses, in various exemplary embodiments, methods for forming channels on a substrate. These channels can be formed by self-assembly methods and allow for consistent reproduction on micrometer scales.

Disclosed in embodiments is a method for forming a channel on a substrate, comprising: providing a first liquid composition comprising a surface modification agent; depositing the first composition on a substrate to form a first feature, wherein the surface modification agent creates a modified region around the first feature; and depositing a second liquid composition on or proximate the modified region around the first substrate to form a second feature; wherein the second composition is repelled by the modified region to form a channel between the first feature and the second feature.

The deposition of the first or second composition may be by printing, such as by inkjet printing.

The surface modification agent may have the structure of Formula (I):

$$X-R \quad \text{(Formula I)}$$

wherein X is selected from the group consisting of —NH$_2$, —NHR', —COOH, —PO$_3$H$_3$, —OPO$_3$H$_3$, —SiCl$_3$, —SiCl(CH$_3$)$_2$, —SiCl$_2$CH$_3$, —Si(OCH$_3$)$_3$, —SiCl$_3$, —Si(OC$_2$H$_5$)$_3$, —SH, —CONHOH, —NCO, (—C$_6$H$_4$N$_3$), and benzotriazolyl; and wherein R and R' are independently a hydrocarbon group containing from 1 to about 60 carbon atoms. In particular embodiments, R is selected from the group consisting of a straight chain alkyl group, a branched alkyl group, a cycloalkyl group, an aryl group, an alkylaryl group, and an arylalkyl group.

The surface modification agent may alternatively be an organoamine, particularly dodecylamine, tridecylamine, tetradecylamine, pentadecylamine, or hexadecylamine.

The first and second compositions may be substantially similar. The liquid composition may comprise metal nanoparticles or metal oxide nanoparticles. The metal nanoparticles may comprise a metal selected from the group consisting of Au, Ag, Cu, Pt, Pd, and Ni. The metal oxide nanoparticles may comprise a metal oxide selected from the group consisting of Al$_2$O$_3$, TiO$_2$, SiO$_2$, ZrO$_2$, ZnO$_2$, CuO, Fe$_2$O$_3$, SnO$_2$, indium tin oxide, and antimony tin oxide.

The substrate may have a hydrophilic surface and/or an elevated temperature. In particular embodiments, the substrate has an advancing water contact angle of less than 60° and the temperature of the substrate is from about 40° C. to about 100° C.

The surface modification agent may comprise from about 0.01 wt % to about 10 wt % of the first liquid composition.

The channel has a length of about 50 microns or less, including from about 20 to about 30 microns.

Disclosed in other embodiments is a printing process for forming a channel on a substrate, comprising: providing a first ink composition comprising silver nanoparticles and a surface modification agent; depositing a first set of ink droplets of the first ink composition on the substrate to form a first feature, wherein the surface modification agent creates a modified region on a modified side of the first feature; and depositing a second set of ink droplets of a second ink composition on the modified side of the first line to form a second feature; wherein the second set of ink droplets is repelled by the modified region so that a channel is formed on the substrate between the first feature and the second feature.

The first and second ink compositions may be substantially the same.

The surface modification agent may also stabilize the silver nanoparticles, such as when the surface modification agent is an organoamine.

The silver nanoparticles may have a low surface polarity. Both the modified region and the first feature may have substantially the same surface energy, that surface energy being lower than the surface energy of a non-modified region of the substrate.

Also disclosed is an ink composition, comprising: a liquid medium; a metal nanoparticle; and a surface modification agent of Formula (I):

$$X-R \quad \text{(Formula I)}$$

wherein X is selected from the group consisting of —NH$_2$, —NHR', —COOH, —PO$_3$H$_3$, —OPO$_3$H$_3$, —SiCl$_3$, —SiCl(CH$_3$)$_2$, —SiCl$_2$CH$_3$, —Si(OCH$_3$)$_3$, —SiCl$_3$, —Si(OC$_2$H$_5$)$_3$, —SH, —CONHOH, —NCO, (—C$_6$H$_4$N$_3$), and benzotriazolyl; and wherein R and R' are independently a hydrocarbon group containing from 1 to about 60 carbon atoms. In particular embodiments, R is selected from the group consisting of a straight chain alkyl group, a branched alkyl group, a cycloalkyl group, an aryl group, an alkylaryl group, and an arylalkyl group.

Disclosed in yet other embodiments is a method of forming a thin film transistor, comprising: providing an ink composition comprising silver nanoparticies and a surface modification agent; depositing a first set of ink droplets of the ink composition on a substrate to form a source pattern or drain pattern, the surface modification agent creating a modified region around the source pattern or drain pattern so formed; and depositing a second set of ink droplets of the ink composition on or proximate to the modified region of the source pattern or drain pattern to form the complementary pattern; wherein the second set of ink droplets is repelled by the modified region so that a channel is formed on the substrate between the source pattern and the drain pattern.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "nano" as used in "silver nanoparticles" indicates a particle size of less than about 1000 nm. In embodiments, the silver nanoparticles have a particle size of from about 0.5 nm to about 1000 nm, from about 1 nm to about 500 nm, from about 1 nm to about 100 nm, and particularly from about 1 nm to about 20 nm. The particle size is defined herein as the average diameter of the silver nanoparticles, as determined by TEM (transmission electron microscopy).

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

Figure 1:
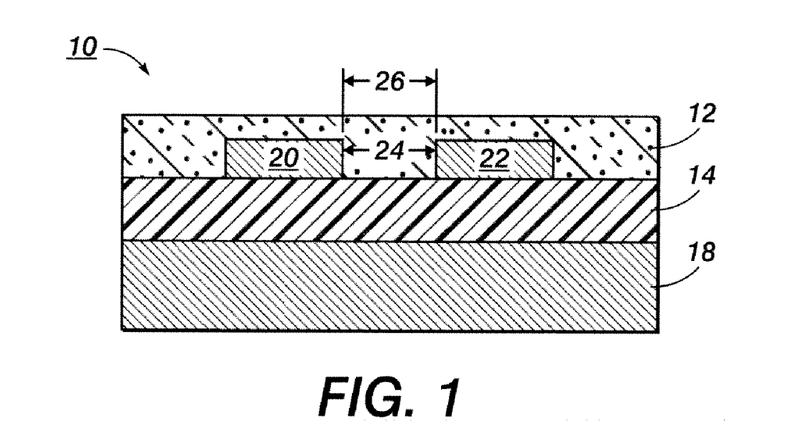
FIG. 1 represents a first embodiment of a thin film transistor containing nanoparticles of the present disclosure.

In FIG. 1, there is schematically illustrated a thin film transistor ("TFT") configuration 10 comprised of a heavily n-doped silicon wafer 18 which acts as both a substrate and a gate electrode, a thermally grown silicon oxide insulating dielectric layer 14 on top of which are deposited two metal contacts, source electrode 20 and drain electrode 22. Over and between the metal contacts 20 and 22 is a semiconductor layer 12 as illustrated herein. The distance between the source electrode 20 and drain electrode 22 defines a channel 24 having a channel length 26.

Figure 2:
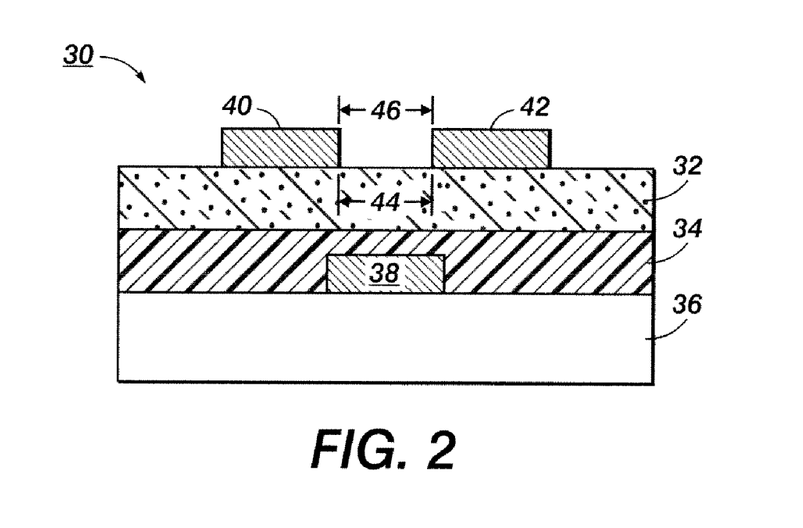
FIG. 2 represents a second embodiment of a thin film transistor containing nanoparticles of the present disclosure.

FIG. 2 schematically illustrates another TFT configuration 30 comprised of a substrate 36, a gate electrode 38, a source electrode 40 and a drain electrode 42, an insulating dielectric layer 34, and a semiconductor layer 32. The distance between the source electrode 40 and drain electrode 42 defines a channel 44 having a channel length 46.

Figure 3:
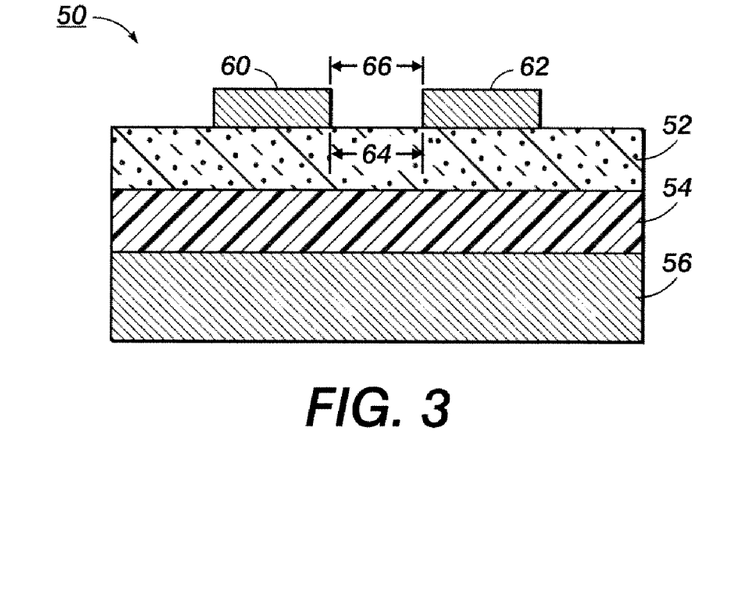
FIG. 3 represents a third embodiment of a thin film transistor containing nanoparticles of the present disclosure.

FIG. 3 schematically illustrates a further TFT configuration 50 comprised of a heavily n-doped silicon wafer 56 which acts as both a substrate and a gate electrode, a thermally grown silicon oxide insulating dielectric layer 54, and a semiconductor layer 52, on top of which are deposited a source electrode 60 and a drain electrode 62. The distance between the source electrode 60 and drain electrode 62 defines a channel 64 having a channel length 66.

Figure 4:
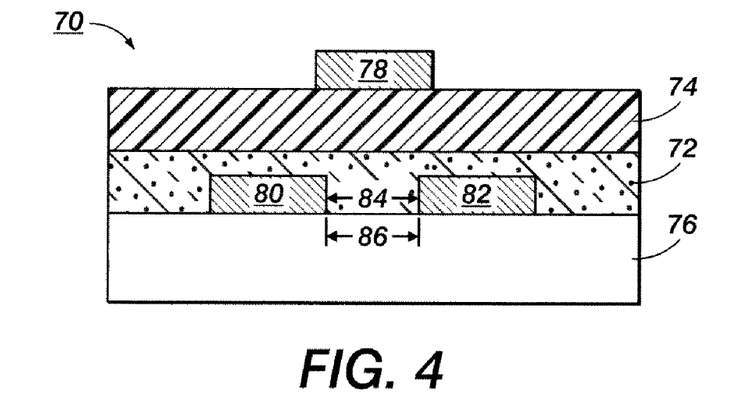
FIG. 4 represents a fourth embodiment of a thin film transistor containing nanoparticles of the present disclosure.

FIG. 4 schematically illustrates an additional TFT configuration 70 comprised of substrate 76, a gate electrode 78, a source electrode 80, a drain electrode 82, a semiconductor layer 72, and an insulating dielectric layer 74. The distance between the source electrode 80 and drain electrode 82 defines a channel 84 having a channel length 86.

The methods of the present disclosure use one or more liquid compositions having a surface modification agent to produce, when deposited on a substrate, channels. For example, in one particular embodiment, the method uses an ink composition comprising silver nanoparticles and a surface modification agent. When applied to a substrate, channels can be formed. These two aspects are described further herein.

Broadly, a channel can be formed on a substrate through the use of two liquid compositions. The first liquid composition comprises a surface modification agent. The surface modification agent may be from about 0.01 weight percent (wt %) to about 20 wt % of the first liquid composition, including from about 0.01 wt % to about 5 wt % of the first liquid composition, or from 10 wt % to about 20 wt % of the first liquid composition. The first liquid composition is deposited on the substrate to form a first feature, such as an electrode. Upon deposition, the surface modification agent creates a modified region around the first feature. The second liquid composition is then deposited on or proximate the modified region to form a second feature. The second composition is repelled by the modified region to form a channel between the first feature and the second feature.

The first liquid composition can be deposited, for example, by printing processes such as microcontact printing, gravure printing, flexographic printing, screen printing, inkjet printing, stencil printing, stamping printing, and the like. In embodiments, the first feature is deposited by an inkjet printing process. The second liquid composition can be deposited by any suitable liquid deposition method such as spin coating, dip coating, bar coating, casting, and the printing processes mentioned above. In embodiments, the second liquid composition is deposited by a printing process. In further embodiments, the second liquid composition is deposited by an inkjet printing process. In some embodiments, at least the first liquid composition is an ink composition, and in other embodiments both the first and second liquid compositions are ink compositions.

The first liquid composition can be the same as or differ from the second liquid composition. For example, the second liquid composition may or may not comprise the surface modification agent. In further embodiments, the first and second liquid compositions are substantially similar.

The character of the substrate can affect the channel formation. The substrate may have a hydrophilic surface (i.e. high surface energy). In embodiments, the substrate has an advancing water contact angle of less than 600, including an advancing water contact angle of less than 30°. The substrate may have an elevated temperature as well during the deposition of the liquid composition(s). In embodiments, the substrate has a temperature of from about 40° C. to about 100° C., including a temperature from about 50° C. to about 80° C. The substrate may also have both a hydrophilic surface and an elevated temperature.

The channel can be formed on any suitable substrate. Exemplary substrates include glass, silicon, plastic substrates such as polyethylene terephthalate (PET) or polyethylene naphthalate (PEN), and the like, and substrates coated with additional layers such as gold.

The surface modification agent may have the structure of Formula (I):

$$X—R \qquad \text{Formula (I)}$$

wherein X is selected from the group consisting of $—NH_2$, $—NHR'$, $—COOH$, $—PO_3H_3$, $—OPO_3H_3$, $—SiCl_3$, $—SiC(CH_3)_2$, $—SiCl_2CH_3$, $—Si(OCH_3)_3$, $—SiCl_3$, $—Si(OC_2H_5)_3$, $—SH$, $—CONHOH$, $—NCO$, $(—C_6H_4N_3)$, and benzotriazolyl; and wherein R and R' are independently a hydrocarbon group containing from 1 to about 60 carbon atoms, including from about 3 to about 32 carbon atoms. In embodiments, R is selected from the group consisting of a straight chain alkyl group, a branched alkyl group, a cycloalkyl group, an aryl group, an alkylaryl group, an arylalkyl group, and the like. Exemplary surface modification agents include primary and secondary organoamines, carboxylic acids, thiols, and organosilanes comprising from about 3 to about 32 carbon atoms.

The liquid compositions further comprise a solute or dispersed substance which is used to form the features. In some embodiments, the solute or dispersed substance is a polymer, such as a conducting polymer, semiconducting polymer, or insulating polymer. In other embodiments, the solute or dispersed substance is an inorganic particle, including metal nanoparticles and metal oxide nanoparticles. Exemplary metal nanoparticles include Au, Ag, Cu, Pt, Pd, Ni, and the like. Exemplary metal oxide nanoparticles include $Al_2O_3$, $TiO_2$, $SiO_2$, $ZrO_2$, $ZnO_2$, $CuO$, $Fe_2O_3$, $SnO_2$, indium tin oxide, antimony tin oxide, and the like. In particular embodiments, the nanoparticles are silver nanoparticles.

In embodiments, the solute or dispersed substance has a low surface energy, or low surface polarity. In further embodiments, the solute or dispersed substance is silver nanoparticles with low surface polarity, particularly silver nanoparticles stabilized with long-chain carboxylic acid and/or long-chain organoamine stabilizers. Polarity refers to the dipole-dipole intermolecular forces between the slightly positively-charged end of one molecule to the negative end of another or the same molecule. For example, $H_2O$ is a polar molecule while $CH_4$ is a nonpolar molecule. In embodiments, the surface of the stabilized silver nanoparticles is composed of low polarity hydrocarbon groups. Polarity affects surface tension, and can be determined by any proper approach. For example, when the stabilized silver nanoparticles were coated as a film, the surface of the film showed a very large advancing water contact angle, indicating a low surface energy and hydrophobic property.

The nanoparticles may have an average diameter of about 100 nanometers or less, preferably about 50 nanometers or less. In some specific embodiments, the nanoparticles have an average diameter of from about 1 nanometer to about 15 nanometers, including from about 2 nanometers to about 10 nanometers. In addition, the particle size distribution width refers to the difference between the diameter of the largest nanoparticle and the diameter of the smallest nanoparticle, or the range between the smallest and largest nanoparticles. In some embodiments, the particle size distribution width of the silver nanoparticles may be from about 10 nanometers to about 50 nanometers, or from about 10 nanometers to about 25 nanometers. In further embodiments, the silver nanoparticles have an average diameter of from about 1 nanometer to about 50 nanometers and a particle size distribution width of from about 10 nanometers to about 30 nanometers. Without being limited by theory, it is believed that these small particle sizes combined with a narrow size distribution width make the nanoparticles easier to disperse when placed in a solvent.

In embodiments, the silver nanoparticles are composed of elemental silver or a silver composite. Besides silver, the silver composite may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising, for example, at least about 20% of the nanoparticles by weight, particularly greater than about 50% of the nanoparticles by weight.

The silver nanoparticles may be stabilized on their surface by a carboxylic acid, a thiol, and/or an organoamine. The carboxylic acid generally has from 4 to about 20 carbon atoms. Exemplary carboxylic acids include butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof. The thiol may be a low molecular weight thiol of the formula $C_nH_{2n+1}SH$, wherein $2 \leq n \leq 20$. Exemplary thiols include 1-butanethiol, 1-pentanethiol, 1-hexanethiol, 1-heptanethiol, 1-octanethiol, dodecanethiol, hexadecanethiol, and the like. Dithiols such as 2-ethanedithiol, 1,3-propanedithiol, 1,4-butanedithiol, and the like, can be used as well. The organoamine may be a primary, secondary, or tertiary amine. Exemplary organoamines include propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, and the like, or mixtures thereof. In specific embodiments, the silver nanoparticles are stabilized with an organoamine selected from the group consisting of dodecylamine, tridecylamine, tetradecylamine, pentadecylamine, and hexadecylamine.

In embodiments, the stabilized silver nanoparticles are composed of elemental silver. The stabilized nanoparticles may have a silver content of about 70% or more, including from about 70% to about 90%, preferably from about 75% to about 85% by weight. This content is higher than that produced by conventional processes. The content can be analyzed with any suitable method. For example, the silver content can be obtained from TGA analysis or ashing method.

The silver nanoparticles may be dissolved in a mixture of a hydrocarbon solvent and an alcohol co-solvent, such as that described in (20081679-US-NP, XERZ 202156). The hydrocarbon solvent may be an aliphatic hydrocarbon including saturated hydrocarbons (alkanes), unsaturated hydrocarbons (alkenes and alkynes), and cycloalkanes. Typically, the alkane solvent contains from 5 to about 20 carbon atoms. In particular embodiments, n-dodecane and isoparaffinic solvents commercially sold under the name ISOPAR® are used as the alkane solvent. In other embodiments, the hydrocarbon solvent is an aromatic hydrocarbon solvent. Typically the aromatic hydrocarbon solvent contains from about 7 to about 20 carbon atoms. In particular embodiments, xylene, mesitylene, or trimethylbenzene are used as the hydrocarbon solvent.

The alcohol co-solvent can be a primary alcohol, a secondary alcohol, or a tertiary alcohol. Typically, the alcohol co-solvent is an unsaturated alcohol comprising from about 6 to about 20 carbon atoms. In particular embodiments, the alcohol co-solvent comprises terpineol. Terpineol has at least four isomers (the alpha, beta, gamma, and 4-isomers). Generally, the terpineol solvent is a majority of the alpha-terpineol isomer when measured by weight. Put in other words, the alpha-terpineol isomer is at least 50 weight percent of the terpineol solvent.

The loading of the silver nanoparticles may be critical to the performance of the ink composition. Better results are obtained when the silver nanoparticles along with any stabilizer) are at least about 35 weight percent of the ink composition, including from about 35 weight percent to about 70 weight percent, or from about 40 weight percent to about 60 weight percent. In addition, the weight ratio of the hydrocarbon solvent to the alcohol co-solvent may also be critical. The weight ratio of the hydrocarbon solvent to the alcohol co-solvent may be less than about 5:1, including from about 5:1 to about 1:2. In particular embodiments, the weight ratio is from about 2:1 to about 1:1. In some embodiments, the silver nanoparticles are at least about 35 weight percent of the ink composition and the weight ratio of the hydrocarbon solvent to the alcohol co-solvent is 2 or less.

The surface modification agent of the liquid or ink composition generally modifies the surface energy of the substrate upon which the liquid or ink composition will be deposited. For example, the surface modification agent may convert a hydrophilic surface to a hydrophobic surface. The surface modification agent may also stabilize the nanoparticles. Put another way, free stabilizer may also act as the surface modification agent. In some embodiments, the surface modification agent is the same as the stabilizer for the nanoparticles. The surface modification agent can be added into the liquid composition at the concentrations described above. In other embodiments, the surface modification agent can be generated in-situ during preparation of the liquid composition. For example, some nanoparticles precipitate/crash out during the preparation of the liquid composition, leaving free stabilizer in the liquid composition as surface modification agent. In particular embodiments, the surface modification agent may be an organoamine, as described above. When the surface modification agent and the stabilizer are the same substance, the concentration of the surface modification agent in the liquid or ink composition excludes the portion of the substance present as the stabilizer. In some embodiments, the surface modification agent is different from the stabilizer for the nanoparticles. For example, organosilane can be added as surface modification agent into an ink composition comprising carboxylic acid stabilized silver nanoparticles.

The methods of the present disclosure are based on deposition of a first set of one or more ink droplets. The surface modification agent, present in the ink droplet(s), will modify the surface of the substrate next to the first set of ink droplets. A second set of one or more ink droplets deposited on, near, adjacent to, or next to the modified surface will self-assemble to be on the other side of the modified surface from the first set of ink droplets. This method is depicted in FIGS. 5A-5D.

Figure 5A:
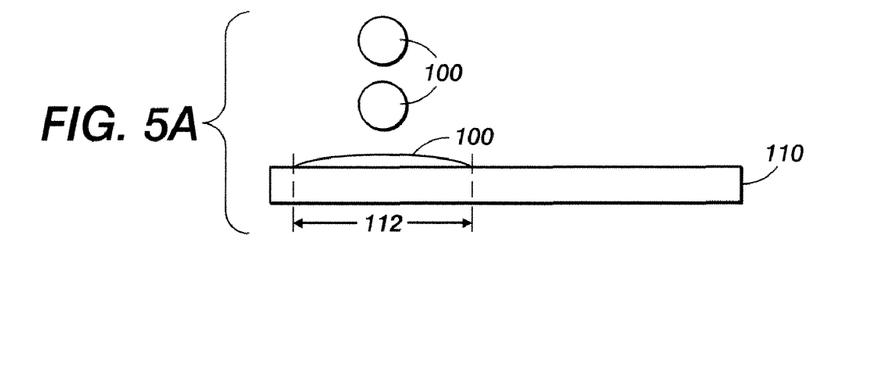
FIGS. 5A-5D illustrate various aspects of the methods of the present disclosure.
Figure 5B:
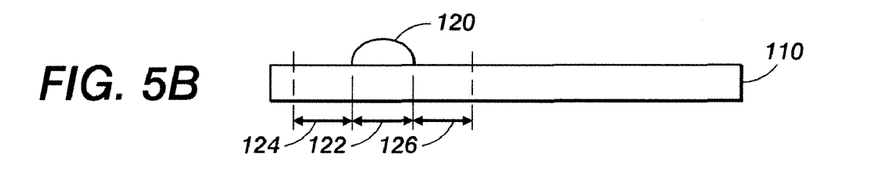

In FIG. 5A, a first set 100 of ink droplets is deposited on a substrate 110 (the ink droplets shown in the air can be considered as falling onto the substrate, which is extending into the paper). As the ink droplet contacts the substrate, it expands due to gravity and the jetting force (or velocity of the droplets) to cover a width 112.

When the solvent evaporates and the conductive silver nanoparticles solidify to form a first feature such as line 120, the ink droplets 100 can be considered as shrinking in width. Where the ink droplets 100 covered width 112 in FIG. 5A, the first line 120 now has a width 122 (see FIG. 5B). The difference in widths forms modified regions 124, 126 on either side of the first printed line 120. The surface of the substrate has been modified in these modified regions by the surface modification agent left behind by the ink droplets as they shrink in width.

Figure 5C:
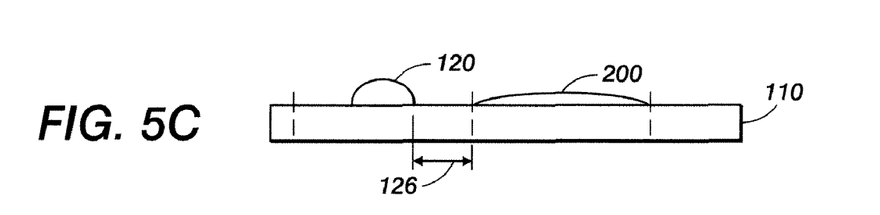

In FIG. 5C, a second set 200 of ink droplets is now deposited on the substrate 110 on one side of the first printed line 120. The second set 200 is generally deposited near (i.e. proximate) the first printed line 120. In some embodiments, the second set of droplets is deposited within twenty microns or less of the first line 120. If the second set 200 of ink droplets is deposited in the modified region 126, the ink droplets are repelled out of the modified region 126 due to the difference in surface energy. In embodiments, the modified region has a lower surface energy than the non-modified region of the substrate. In further embodiments, the surface of the first printed feature has the substantially the same surface energy as the modified region, wherein both have a lower surface energy than the non-modified region of the substrate. If the second set 200 of ink droplets is deposited outside of the modified region 126, as shown here, then when the ink droplets expand upon contact with the substrate, they will not enter the modified region 126 due to the difference in surface energy. As a result, the second set 200 of ink droplets self-assemble at a position where the surface is not modified.

Figure 5D:
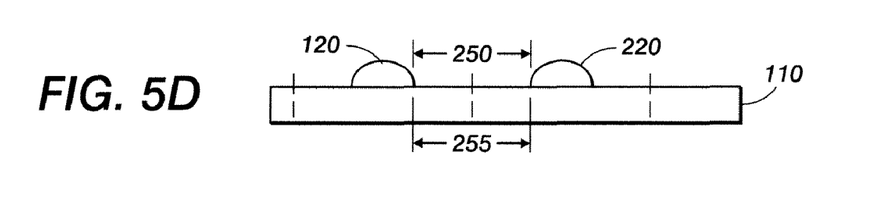

In FIG. 5D, the second set 200 of ink droplets then dries and solidifies to form second feature or line 220. Channel 250 is formed within the region between first line 120 and second line 220. The modified region 126 can alternatively be considered as the channel. The channel 250 will have a length 255. The channel length may be about 50 microns or less, including 30 microns or less. In some desirable embodiments, the channel length is from about 20 to about 30 microns. The first and second features may be the source and drain electrodes of a thin film transistor. One of the electrodes is formed from the first liquid or ink composition, then the complementary electrode is formed from the second liquid or ink composition.

The channel length can be controlled in at least four different ways. First, the degree to which an ink droplet expands as it contacts the substrate can be controlled by changing the jetting force, the nozzle size, and other jetting conditions. Second, the size of the modified region can be controlled by changing the amount of surface modification agent in the ink droplet. In embodiments, the surface modification agent comprises from about 0.01 wt % to about 10 wt % of the first and/or second ink compositions. Third, the size of the modified region can be controlled by changing the evaporation rate of the solvents of the liquid composition and the viscosity of the liquid composition. Low viscosity and slow evaporation rate may result in a larger modified region, therefore a larger channel length. In embodiments, the ink composition has a viscosity of from about 2 centipoises to about 15 centipoises, including from about 4 centipoises to about 10 centipoises. The solvent may have a boiling point from about 140° C. to about 300° C., including from about 150° C. to about 250° C.

Finally, the channel length could be affected by where the second set of ink droplets is deposited relative to the first line and the modified region. For example, if the amount of surface modification agent in the ink composition is such that the modified region has a width of 30 microns, then the second set of ink droplets could be deposited such that any modified region formed by the second set would overlap the modified region formed by the first line. In other words, the channel length could be modified between 30 microns and 60 microns.

Evaporation of solvent and solidification of the solute or dispersed substance forms the features. The features can be, for example, a line, dot, or layer in any shape. In embodiments, evaporation of solvent and solidification of the silver nanoparticles forms features comprising silver nanoparticles. The deposited silver nanoparticles at this stage may or may not exhibit electrical conductivity. Heating the deposited nanoparticles features at a temperature of below about 300° C., preferably at or below about 250° C., including at or below about 150° C. causes them to coalesce to form electrically conductive layers which are suitable for use as conductive elements in electronic devices. The heating is performed for a time ranging from, for example, about one minute to about 10 hours, particularly from about 5 minutes to about 1 hour. The heating can be done at a temperature of from about 80° C. to about 300° C. In more specific embodiments, the heating is performed at a temperature of from about 100° C. to about 250° C. or from about 120° C. to about 200° C. Other methods, such as laser annealing, can also be used to cause coalescence of the silver nanoparticles to form conductive features.

The conductivity of the resulting silver-containing elements produced by heating the deposited silver nanoparticles is, for example, at least one thousand S/cm. In other embodiments, the conductivity is at least ten thousand S/cm as measured by four-probe method.

The printed channel can be used for any application. For example, small channels between two features can be used as banks or templates for depositing other materials. The small channels can also be used to make micro-fluid devices. In embodiments, when a liquid composition containing conductive particles is used, the resulting conductive elements can be used as conductive electrodes, conductive pads, conductive lines, conductive tracks, and the like in electronic devices such as thin film transistors, organic light emitting diodes, RFID (radio frequency identification) tags, photovoltaic devices, and other electronic devices which require conductive elements or components. The present methods are particularly useful in creating transistor arrays wherein the transistors have consistent channel length.

As previously mentioned, TFTs are generally composed of a supporting substrate, three electrically conductive electrodes (gate, source and drain electrodes), a channel semiconducting layer, and an electrically insulating gate dielectric layer separating the gate electrode from the semiconducting layer.

The substrate of the TFT may be composed of, for instance, silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present disclosure. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating dielectric layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in U.S. Pat. Nos. 6,621,099; 6,770,904; and 6,949,762; and "Organic Thin Film Transistors for Large Area Electronics" by C. D. Dimitrakopoulos and P. R. L. Malenfant, *Adv.*

Mater., Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating dielectric layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference. The silver nanoparticles can be deposited as a layer upon any suitable surface, such as the substrate, the dielectric layer, or the semiconductor layer.

The following examples are for purposes of further illustrating the present disclosure. The examples are merely illustrative and are not intended to limit devices made in accordance with the disclosure to the materials, conditions, or process parameters set forth therein.

EXAMPLE

An ink composition was made containing 40 wt % silver nanoparticles, 40 wt % dodecane, and 20 wt % terpineol. The silver nanoparticles were stabilized with an organoamine. A small amount of the organoamine (around 1 wt %) was present as free stabilizer and functioned as surface modification agent.

Figure 6:
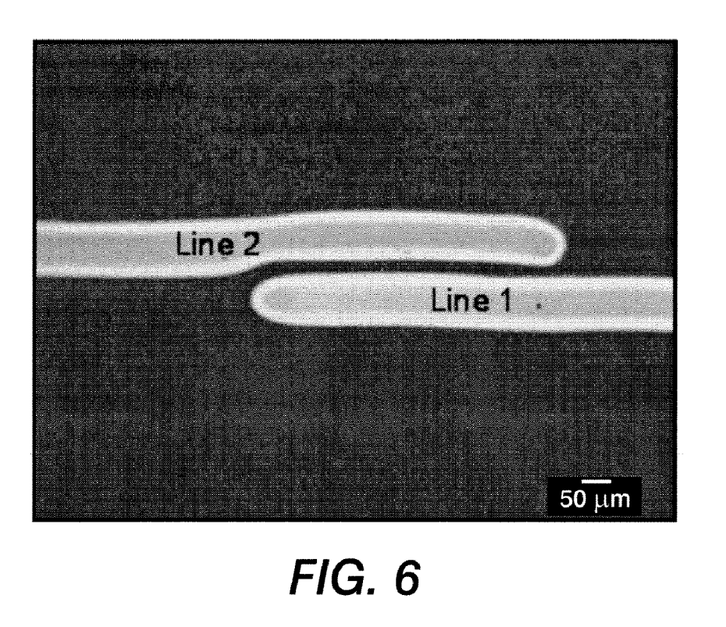
FIG. 6 is a picture showing two lines printed according to the methods of the present disclosure.

The ink was jetted onto a plasma cleaned glass substrate using a Fujifilm® Dimatix® DMP-2800 series printer. The substrate temperature was 60° C. In FIG. 6, the line on the right was printed first, then the second line was printed on the left. A modified region was formed by the surface modification agent when the first line was printed, which caused the second line to bend around the first line, forming a gap (i.e. channel) between the two lines. The channel was very uniform and had smooth edges. The gap was about 30 microns.

Figure 7:
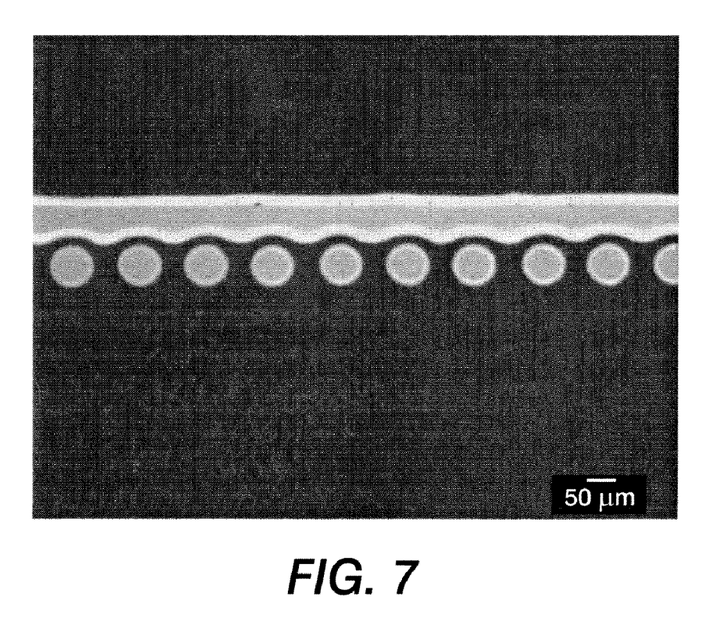
FIG. 7 is a picture showing a series of dots and a line printed according to the methods of the present disclosure.

In FIG. 7, a series of dots was printed. Next, a line was printed. The edge of the line curved consistently according to the position of the dots to form a uniform gap between the dot and the line. This indicated that the process is reproducible, consistently forming gaps or channels of small but uniform length.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A method for forming a channel on a substrate, comprising:
providing a first liquid composition comprising a surface modification agent;
depositing the first composition on a substrate to form a first feature, wherein the surface modification agent creates a modified region around the first feature; and
depositing a second liquid composition on or proximate the modified region around the first feature to form a second feature;
wherein the second composition is repelled by the modified region to form a channel between the first feature and the second feature.

2. The method of claim 1, wherein the deposition of the first or second composition is by printing.

3. The method of claim 2, wherein the printing is by inkjet printing.

4. The method of claim 1, wherein the surface modification agent has the structure of Formula (I):

(Formula I)

wherein X is selected from the group consisting of —NH$_2$, —NHR', —COOH, —PO$_3$H$_3$, —OPO$_3$H$_3$, —SiCl$_3$, —SiCl(CH$_3$)$_2$, —SiCl$_2$CH$_3$, —Si(OCH$_3$)$_3$, —SiCl$_3$, —Si(OC$_2$H$_5$)$_3$, —SH, —CONHOH, —NCO, (—C$_6$H$_4$N$_3$), and benzotriazolyl; and wherein R and R' are independently a hydrocarbon group containing from 1 to about 60 carbon atoms.

5. The method of claim 4, wherein R is selected from the group consisting of a straight chain alkyl group, a branched alkyl group, a cycloalkyl group, an aryl group, an alkylaryl group, and an arylalkyl group.

6. The method of claim 1, wherein the surface modification agent is an organoamine.

7. The method of claim 6, wherein the organoamine is selected from the group consisting of dodecylamine, tridecylamine, tetradecylamine, pentadecylamine, and hexadecylamine.

8. The method of claim 1, wherein the first and second compositions are substantially similar.

9. The method of claim 1, wherein the first liquid composition comprises metal nanoparticles or metal oxide nanoparticles.

10. The method of claim 9, wherein the metal nanoparticles comprise a metal selected from the group consisting of Au, Ag, Cu, Pt, Pd, and Ni; and
the metal oxide nanoparticles comprise a metal oxide selected from the group consisting of Al$_2$O$_3$, TiO$_2$, SiO$_2$, ZrO$_2$, ZnO$_2$, CuO, Fe$_2$O$_3$, SnO$_2$, indium tin oxide, and antimony tin oxide.

11. The method of claim 1, wherein the substrate has a hydrophilic surface and the substrate is at an elevated temperature.

12. The method of claim 11, wherein the substrate has an advancing water contact angle of less than 60° and the temperature of the substrate is from about 40° C. to about 100° C.

13. The method of claim 1, wherein the surface modification agent comprises from about 0.01 wt % to about 20 wt % of the first liquid composition.

14. The method of claim 1, wherein the channel has a length of about 50 microns or less.

15. The method of claim 1, wherein the channel has a length of from about 20 to about 30 microns.

16. A printing process for forming a channel on a substrate, comprising:
providing an first ink composition comprising silver nanoparticles and a surface modification agent;
depositing a first set of ink droplets of the first ink composition on the substrate to form a first feature, wherein the surface modification agent creates a modified region on a modified side of the first feature; and depositing a second set of ink droplets of a second ink composition on the modified side of the first feature to form a second feature;

wherein the second set of ink droplets is repelled by the modified region so that a channel is formed on the substrate between the first feature and the second feature.

17. The method of claim 16, wherein the first ink composition and the second ink composition are substantially the same.

18. The method of claim 16, wherein the silver nanoparticles comprise organoamine stabilizers.

19. The method of claim 16, wherein the silver nanoparticles have a low surface polarity.

20. The method of claim 16, wherein both the modified region and the first feature have substantially the same surface energy, and the surface energy of both the modified region and the first feature is lower than the surface energy of a non-modified region of the substrate.

21. The method of claim 16, wherein the surface modification agent also stabilizes the silver nanoparticles.

22. The method of claim 16, wherein the surface modification agent is an organoamine.

23. The method of claim 16, wherein the substrate has an advancing water contact angle of less than 60° and the temperature of the substrate is from about 40° C. to about 100° C.

24. The method of claim 16, wherein the surface modification agent comprises from about 0.01 wt % to about 10 wt % of the ink composition.

25. The method of claim 16, wherein the channel has a length of about 50 microns or less.

26. A method of forming a thin film transistor, comprising:

providing an ink composition comprising silver nanoparticles and an organoamine;

depositing a first set of ink droplets on a substrate to form a source pattern or drain pattern, the organoamine creating a modified region around the source pattern or drain pattern so formed; and depositing a second set of ink droplets on or proximate to the modified region of the source pattern or drain pattern to form the complementary pattern;

wherein the second set of ink droplets is repelled by the modified region so that a channel is formed on the substrate between the source pattern and the drain pattern.

* * * * *